United States Patent
Wang et al.

(10) Patent No.: US 9,655,268 B2
(45) Date of Patent: May 16, 2017

(54) OPERATING CONTROL UNIT FOR AN ELECTRICAL APPLIANCE AND ELECTRICAL APPLIANCE

(71) Applicant: E.G.O. Elektro-Geraetebau GmbH, Oberderdingen (DE)

(72) Inventors: Peiliang Wang, Shanghai (CN); Yizhou Yang, Shanghai (CN); Xia Shen, Shanghai (CN)

(73) Assignee: E.G.O. Elektro-Geraetebau GmbH, Oberderdingen (DE)

( * ) Notice: Subject to any disclaimer, the term of this patent is extended or adjusted under 35 U.S.C. 154(b) by 0 days.

(21) Appl. No.: 14/872,803

(22) Filed: Oct. 1, 2015

(65) Prior Publication Data

US 2016/0105985 A1    Apr. 14, 2016

(30) Foreign Application Priority Data

Oct. 9, 2014 (CN) .......................... 2014 1 0526499

(51) Int. Cl.
*H05K 7/00* (2006.01)
*H05K 7/14* (2006.01)
*H03K 17/96* (2006.01)

(52) U.S. Cl.
CPC ............. *H05K 7/14* (2013.01); *H03K 17/964* (2013.01); *H03K 2217/96015* (2013.01); *H03K 2217/96027* (2013.01); *H03K 2217/960755* (2013.01)

(58) Field of Classification Search
CPC ................... H05K 7/14; H05K 17/964; H05K 2217/96015; H05K 2217/96027; H05K 2217/960755

(Continued)

(56) References Cited

U.S. PATENT DOCUMENTS 7,573,701 B2 *   8/2009   Doberstein ........... F25D 29/005
                                                  236/94
7,911,321 B2 *   3/2011   Bingle ..................... E05B 81/76
                                                  340/5.54

(Continued)

FOREIGN PATENT DOCUMENTS

DE   102012010321 A1   11/2013
EP       1806845 A2    7/2007

(Continued)

OTHER PUBLICATIONS

European Patent Office, Extended European Search Report for Application No. 15187020.1, Mar. 3, 2016, 8 pages, Germany.

*Primary Examiner* — Hung S Bui
(74) *Attorney, Agent, or Firm* — Alston & Bird LLP

(57) ABSTRACT

An operating control unit for an electrical appliance with an operating field is mounted on an underside of the operating field. The operating control unit includes a frame body, a flat component carrier being mounted to the frame body from behind and having piezo-active sensor elements, and a back support mounted to a back side of the frame body and enclosing the component carrier. The operating control unit has after pre-assembly two different assembly states. In a pre-mount state the back support is fixed to the frame body enclosing the component support, and some locking means of the frame body are formed as pre-mount locking means and are holding the back support against disassembly. In a final-assembly state the back support is pressed against the frame body with less distance between the two, and final-assembly locking means of the frame body are holding the back support in a closer position than the pre-mount locking means.

15 Claims, 3 Drawing Sheets

(58) Field of Classification Search
USPC .......................... 361/728–729, 807, 809, 810
See application file for complete search history.

(56) References Cited

U.S. PATENT DOCUMENTS

| | | | |
|---|---|---|---|
| 8,648,832 B2* | 2/2014 | Maloof | H03K 17/9622 |
| | | | 178/18.05 |
| 8,742,647 B2 | 6/2014 | Fluhrer | |
| 8,922,979 B2 | 12/2014 | Fluhrer | |
| 9,392,707 B2* | 7/2016 | Fujita | H05K 5/0017 |
| 2004/0160414 A1* | 8/2004 | Armstrong | G06F 3/0338 |
| | | | 345/156 |
| 2006/0177212 A1 | 8/2006 | Lamborghini et al. | |
| 2006/0262549 A1* | 11/2006 | Schmidt | G07C 9/0069 |
| | | | 362/459 |
| 2007/0157477 A1 | 7/2007 | Sellien | |
| 2009/0128375 A1* | 5/2009 | Heimann | H03K 17/9643 |
| | | | 341/34 |
| 2009/0160529 A1 | 6/2009 | Lamborghini et al. | |
| 2015/0123936 A1 | 5/2015 | Keller | |

FOREIGN PATENT DOCUMENTS

| | | |
|---|---|---|
| EP | 2144372 A1 | 1/2010 |
| WO | WO 2006/066097 A2 | 6/2006 |
| WO | WO 2011/003912 A1 | 1/2011 |

\* cited by examiner

OPERATING CONTROL UNIT FOR AN ELECTRICAL APPLIANCE AND ELECTRICAL APPLIANCE

CROSS-REFERENCE TO RELATED APPLICATIONS

This application claims priority to Chinese Application No. 201410526499.X, filed Oct. 9, 2014, the contents of which are hereby incorporated herein in its entirety by reference.

TECHNOLOGICAL FIELD

The invention is directed to an operating control unit for an electrical appliance with an operating field, wherein the operating control unit has switches. These switches are marked on the topside of the operating field and are being actuated by pressing a finger onto them. The operating control unit is be mounted on an underside of the operating field. The invention is also directed to an electrical appliance with such an operating control unit.

BACKGROUND

Such an operating control unit is, for example, known from EP 2144372 A1, where piezo-active sensor elements are provided underneath an operating field.

A further example is known from WO 2011/003912 A1, wherein an operating control unit with piezo-active sensor elements is combined with a light guide device for marking the location of the switches upon which a finger has to be pressed.

BRIEF SUMMARY

It is an object of the invention to provide an operating control unit as mentioned before as well as an electrical appliance with such an operating control unit. The operating control unit is provided with piezo-active sensor elements for forming pressure-sensitive switches, wherein preferably the operating control unit is designed to be easily pre-mounted and finally assembled.

This object is achieved by an operating control unit as well as an electrical appliance. Advantageous and preferred embodiments of the invention are the subject of the further claims and will be explained in more detail in the following. Some of the technical features will be described only for the operating control unit or only for the electric appliance. However, independently thereof, they shall be applicable to the operating control unit as well as to the electric appliance in independent manner. The wording of the claims is incorporated into the description by explicit reference.

The operating control unit comprises a frame body with a frame topside, wherein it is to be mounted to an underside of an operating field of the electrical appliance with this frame topside. The frame body has locking means which protrude from the frame body, preferably as longitudinal hooks or the like, which protrude away from the frame body in a direction away from the frame topside and away from the operating field. A flat component carrier or circuit board of the operating control unit is mounted to the frame body from a direction from behind, which means that this mounting direction runs from the backside of the frame body to the frame topside. This component carrier has several piezo-active sensor elements provided on it, preferably provided on a topside of the component carrier that faces the frame body and especially the underside of the operating field. In this way, any pressure exerted onto the operating field by a finger pressed against it can be transmitted to one of the piezo-active sensor elements and generates an electrical signal in a way known in the art. Any bending or deformation of the piezo-active sensor element, it being provided either on the topside of the component carrier or on its underside, can be used for this. In a preferred application, the piezo-active sensor elements are provided on the topside of the component carrier.

The operating control unit also comprises a back support mounted to a backside of the frame body, wherein this back support also encloses the component carrier. Preferably, the back support fixes the component carrier with the sensor elements to the frame body and by this to the operating field. The back support is fixed to the frame body via the above-mentioned locking means of the frame body, wherein these locking means are interlocking with counter-locking means on the back support, preferably also in the form of hooks or recesses into which hooks of the frame body may lock.

It is further provided that after a so-called pre-assembly the operating control unit has two different assembly states. A first state is a pre-mount state and a second state is a final-assembly state. In the pre-mount state, that is when the operation control unit is pre-assembled, the back support is fixed to the frame body enclosing the component support. This prevents the component support from getting lost. Preferably, in the pre-mount state the component support is largely in its position of the final-assembly state at or in the frame body, which means that the back support also fixes the component support in the correct position on the frame body. Some of the locking means of the frame body are formed as pre-mount locking means, and these pre-mount locking means are holding the back support to the frame body against disassembly. In this state, the operating control unit can be delivered to a manufacturer of the electrical appliance.

In the final-assembly state, the back support has been pressed somewhat closer to or against the frame body such that there is less distance between them than in the pre-mount state, or even no distance if they are pressed directly together. So, if the operating control unit has to be brought from the pre-mount state to the final-assembly state, the back support and the frame body are pressed together. Final-assembly locking means of the frame body are provided for holding the back support in a closer position to the frame body or the frame topside than the pre-mount locking means have done before. In some way, the invention is about a two-step assembly of the operating control unit with the frame body, the component carrier and the back support. Not only in the final-assembly state are the frame body and the back support connected to each other with the component carrier enclosed between them such that they cannot fall apart again, but also in the pre-mount state. In practice, the operating control unit is fixed, glued or otherwise mounted on the underside of the operating field in the pre-mount state. After that, the back support is pressed against or into the frame body into the final-assembly state, and then the operating control unit is finally assembled and affixed to the operating field.

Pre-mount locking means may advantageously be provided for holding frame body, component carrier and back support in the pre-mount state. They are preferably self-locking or automatically locking, which means that they lock automatically without any need to interact when pressing the back support onto the frame body. The pre-mount locking means may advantageously be provided on the frame body.

In an embodiment of the invention, the back support in the final-assembly state can be between 1 mm and 5 mm or even up to 10 mm closer to the frame body than in the pre-mount state. This means that the distance about which the two parts are pressed together is in the range of some millimeters.

Spring elements can be provided between the component carrier and the back support, wherein these spring elements are formed for pressing the component carrier in an elastic way in the direction towards the frame body or into the frame body and towards the underside of the operating field. These spring elements and their elasticity serve for protecting the component carrier and its sensor elements against damaging or destruction. In a preferred embodiment, the spring elements are arranged on the back support or fixed to the back support. The arrangement of the spring elements is such that each piezo-active sensor element has two neighboring spring elements or that each piezo-active sensor element is placed between two neighboring spring elements. Even more preferably, the sensor element and the spring elements do not overlap. The spring elements may be provided in a row, such that they have a constant distance to each other and that also the sensor elements with constant distance to each other are placed relatively to them in the above-described way.

As one alternative, the spring elements may be integrally formed on the back support as flexible spring arms or the like, wherein also the back support is made from elastic resin, such as thermo-plastics. As another alternative, the spring elements may be elastically deformable bodies in block-like form being made from elastic material. Preferably, these spring elements are made from elastic foam material. These deformable bodies are arranged in receiving openings of the back support which are provided with hook means or the like on the inner side of the receiving openings. The spring elements are fixed in the receiving openings after insertion, mainly by means of these hook means or because the receiving openings are slightly smaller than the outer dimensions of the spring elements.

The component carrier is preferably arranged inside the frame opening, wherein the frame opening may be formed as a kind of very short channel with inner frame opening walls or an inner rim, in which the component carrier is placed. The component carrier may be secured by holding means on its upper side or above the component carrier, wherein these holding means prevent the component carrier from moving in a direction towards the operating field over the topside of the frame body or out of the frame opening, respectively. Otherwise, the component carrier might fall out of the operating control unit in the pre-mount state. The holding means may be provided on the topside of the frame body or, alternatively, on the backside of the component carrier itself, for example as hooks or holders protruding over the side of the component carrier and overlapping the frame opening. Alternatively, the holding means may also be inserted into the frame opening. Of course, it is preferably provided that the holding means themselves do not fall out of the frame opening or out of the frame body in the pre-mount state. In a preferred embodiment, the holding means are in the form of a web or as thin long holder grates. They can extend roughly over the same area or size as the component carrier and may also have hooks or protrusions that prevent them from falling through the frame opening.

In an advantageous embodiment of the invention, force transfer means are provided on the top-side or above the piezo-active sensor elements. The force transfer means are provided with pressure elements, wherein these pressure elements are relatively small or have a cross-section that is significantly smaller than the size of a piezo-active sensor element. The pressure elements are arranged on a force transmission holder in an elastic way, which holder is formed preferably in one piece. The advantage of these force transfer means or the pressure elements, respectively, is that they are in contact with the underside of the operating field on the one hand and with the component carrier above the piezo-active sensor elements or rest against these piezo-active sensor elements, respectively, on the other hand. As the operating field after exerting pressure with a finger put onto it may bend only slightly, for example for 0.01 mm up to 0.1 mm or even 0.5 mm, this does not lead to a significant bulge on the underside of the operating field which, in turn, may lead to a rather strong deformation of the piezo-active sensor element. If, however, such a relatively small pressure element is provided, it exerts the pressing force of the operating field onto the piezo-active sensor element or the component carrier above it on one small spot, which again will effect a significantly stronger deformation of the piezo-active sensor element. This in turn generates a stronger electric signal for better evaluation of an actuation of the operating control unit.

The force transmission holder may be arranged in the frame opening above the component carrier or, respectively, between the component carrier and the underside of the operating field. In a further embodiment, the force transmission holder may be the same part as the holding means for the component carrier described above. In this case, the force transmission holder may also have the purpose of preventing the component carrier from falling out of the frame body or the frame opening, respectively.

Preferably, the pressure elements are provided on the force transmission holder in a defined position by way of elastically deformable holding arms. These holding arms are designed for giving utmost flexibility and movability to the pressure elements, such that they are fixed and, especially, provided in a fixed position in relation to the piezo-active sensor element and the operating field. However, they do not provide any significant resistance against the operating field being pressed inwards.

In the pre-mount state the piezo-active sensor elements may be pressed against the pressure elements of the force transfer means, wherein these pressure elements do not project over the plane of the frame opening or the topside of the frame body in the pre-mount state. This may even be realized by forming the pressure elements and their holder arms such that they project slightly in a direction away from the operating field. Also in this pre-mount state, the spring elements of the back support are already in contact with the underside of the component carrier. This means that the component carrier may be moved in a direction perpendicular to the operating field by way of major force, but not in the normal course of assembly and transport to a final assembly site of the electrical appliance. Furthermore, it may be provided that in the final-assembly state the pressure elements would project over the plane of the topside of the frame body and also contact the component carrier or its piezo-active sensor elements, respectively. This provides a definite and good direct contact between them. As the final-assembly state of the operating control unit is only reached after the frame body has been affixed to the underside of the operating field, the pressure elements can only be pressed against this underside of the operating field. However, they cannot move above the plane of the topside of the frame body. Consequently, they exert some pressure in the other direction against the piezo-active sensor elements or the component carrier, respectively. This pressing force is somewhat absorbed by the spring elements described before. Most important, this means that in the finally assembled state of the operating control unit, any movement or pressing in of the operating field roughly above such a pressure element or its piezo-active sensor element, respectively, is transformed into a force directly onto the piezo-active sensor element.

In a preferred embodiment of the invention, distance elements are provided between the frame body and the back support. They can be provided either on the frame or on the back support, potentially also on both of them. In the pre-mount state the distance elements are in contact with the other part when they are in a pre-mount position. These distance elements serve to keep the two parts from moving closer to each other than this pre-mount state. As described before, the pressure elements provided above the piezo-active sensor elements would then protrude over the plane of the topside of the frame, which again might negatively impair its fixing to the underside of the operating field. This has to be prevented by the distance elements. When the back support and the frame body are pressed together or assembled into the pre-mount state, the distance elements automatically prevent them from moving closer together. Furthermore, the distance elements are arranged and formed in a way that they can be moved or brought out of this pre-mount position into a final-assembly position. Preferably, the distance elements are elastic and are bendable or movable to a side. In the final-assembly position of the distance elements, the back support and the frame body can be moved closer or pressed closer to each other to get into the final-assembly state. In this final-assembly state again, the distance elements may be without any function whatsoever. It is possible that the distance elements may be formed as a kind of reverse hooks when compared to the hooks of the above-mentioned locking means. This may be such that the distance elements come into action automatically and, without any special activation, prevent the frame body and the back support from being pressed together too close. For the final assembly of the operating control unit, they may be moved or bent to the side with a screwdriver or any other flat tool, such that they are out of the way. The number of distance elements needs not be so high as the number of locking means for the final-assembly state.

These features and further features arise not only from the claims but also from the description and the drawings, wherein the individual features can be realized in each case on their own or in sub-combinations thereof in an embodiment of the invention and in other fields and can represent advantageous embodiments protectable per se, for which protection is hereby claimed. The division of the application into individual sections as well as cross headings does not limit the general validity of the statements made therein.

BRIEF DESCRIPTION OF THE SEVERAL VIEWS OF THE DRAWINGS

Exemplary embodiments of the invention are schematically shown in the drawings and will be explained in more detail in the following. The drawings show in.

DETAILED DESCRIPTION

Figure 1:
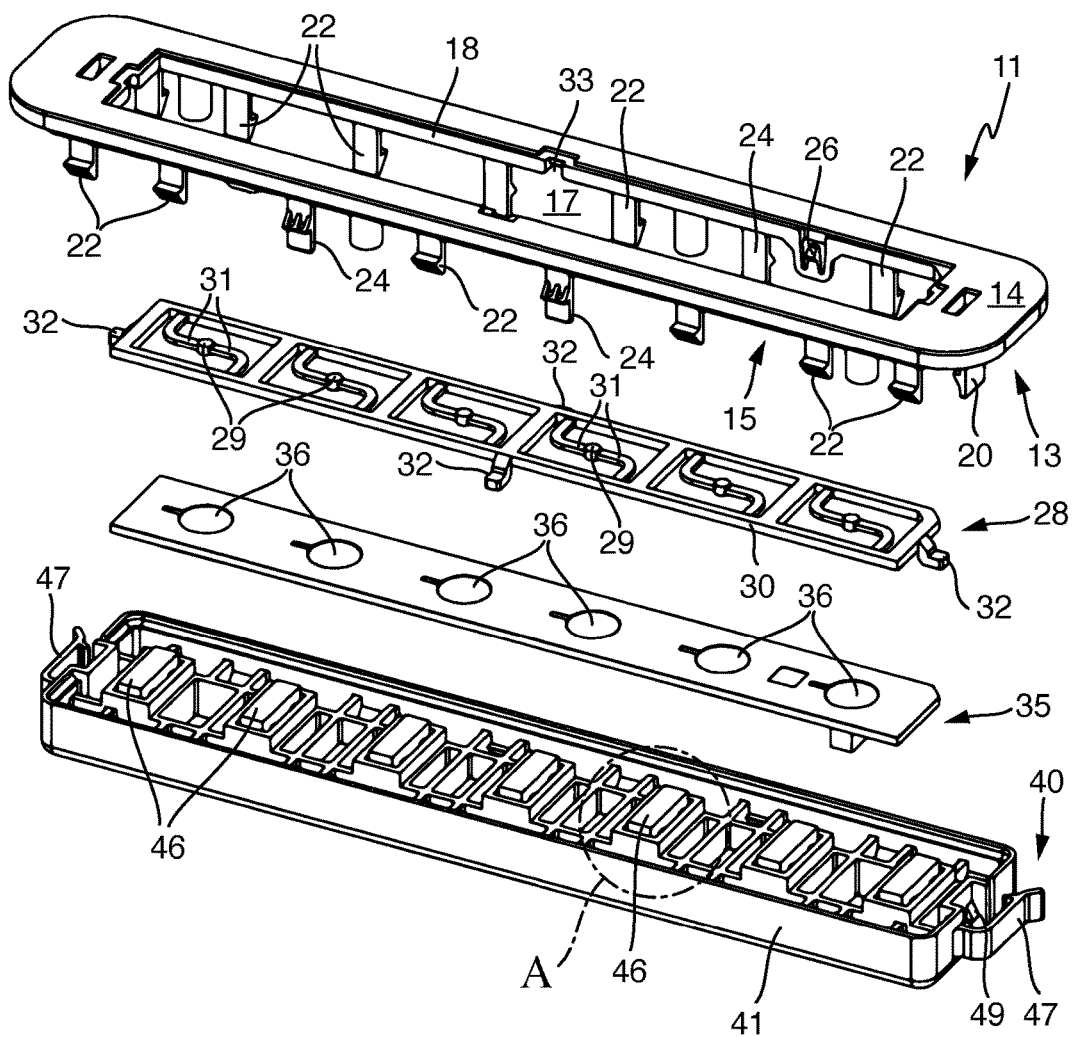
FIG. 1 is an exploded view of the four parts of a control unit according to the invention.

In FIG. 1, an operating control unit according to the invention is shown in an exploded view, which comprises mainly four parts. A frame body 13 has a smooth and, in this case, flat frame topside 14 as well as a frame backside 15, which is obviously not flat. Frame topside 14 can also be curved slightly or be somewhat spherical, although this should also only be slightly. Frame body 13 has a frame opening 17 in rectangular form. This frame opening 17 has an inner rim 18 being mainly circumferential. The height of the inner rim 18 may be some millimeters, for example between 2 mm and 5 mm or even 8 mm. The length of frame body 13 may be between 10 cm and 30 cm.

On the underside or the frame backside 15 several hooks are provided. At the short ends of frame body 13, two pre-mount hooks 20 are provided. Their function as well as the function of the other hooks will be described later. Furthermore, along each lateral side several final-assembly hooks 22 are provided, which are somewhat shorter. Two distance elements 24 are also provided on each lateral side.

The next part is a force transmission holder 28, which is formed in web-like form. Six pressure elements 29 in the form of short rods are provided, which are secured to a holder frame 30 by holder arms 31. The special form of holder arms 31 serves for the pressure elements 29 being able to be moved in a direction perpendicular to the plane of holder frame 30 without too much counterforce, that is to say with a maximum of elasticity. At each end side and the center of the lateral sides, short protrusions 32 are provided. They are formed such as to fit exactly in gaps 33 on the inner rim 18 of frame body 13, of which one is depicted above. Furthermore, holder frame 30 or the force transmission holder 28 fits exactly into frame opening 17, as can also be seen from FIG. 4. The thickness of pressure elements 29 is about the thickness of the holder frame 30 or slightly larger, such that the pressure elements may protrude slightly above holder frame 30 in at least one direction. In any case, the thickness of pressure element 29 must be larger than the one of all holder arms 31, which in any case should be thin for better elasticity.

Underneath the force transmission holder 28, a printed circuit board 35 as the above-mentioned component carrier is provided. On this printed circuit board 35, several piezo-active sensor elements 36 are provided. They may be provided as a coating or as separate parts to be fixed on the board, as is known from the above-mentioned prior art EP 2144372 A1 or WO 2011/003912 A1, for example. An electrical contact to the piezo-active sensor elements 36 is also not shown here, which is also known in the art. Printed circuit board 35 has about the thickness of holder frame 30 and also rather the exact size of frame opening 17, such that both parts fit into the frame opening, as can be taken from FIG. 4. At the left front corner, force transmission holder 28 and printed circuit board 35 have a small notch, which fits exactly into the correspondingly shaped left front corner of frame opening 17. This serves for avoiding the two parts to be inserted into the frame opening 17 in a wrong way.

It can clearly be seen that force transmission holder 28 prevents itself and the printed circuit board 35 to fall out of the frame opening 17 to its topside 14 by way of protrusions 32. As the printed circuit board 35 is pressed against frame backside 15, it serves for holding force transmission holder 28 in place.

Figure 2:
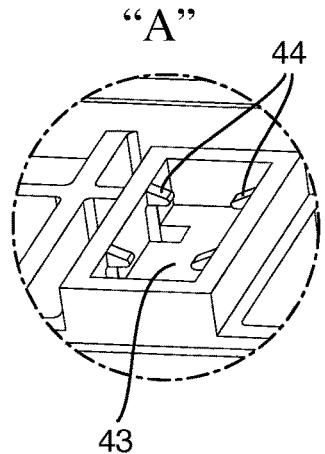
FIG. 2 is an enlarged view of a receiving opening for a spring body in the back support.

The next part is back support 40, which is formed in some way as a kind of back support casing 41 with a closed and surrounding outer lateral rim side and a web-like inner construction. In this inner construction, as can be taken from the enlarged area A of FIG. 2, receiving openings 43 are provided which have small spring element hooks 44 on their inner lateral sides. Receiving openings 43 serve for inserting rectangular and block-like spring bodies 46 as shown in FIG. 1, which are pressed into receiving openings 43 and which are firmly held in place by the spring element hooks 44. The spring bodies 46 may be formed of elastic material, preferably an elastic foam material as is basically known in the art. The spring bodies 46 should protrude somewhat over the topside of the openings 43 such that the printed circuit board 35 rests upon their topsides, and especially only on their topsides. It can also be taken from FIG. 1 that, when printed circuit board 35 and back support 40 are pressed against each other, the piezo-active sensor elements 36 are each placed centrally between two such spring bodies 46. That means that for each of them the same defined conditions apply. The spring force of the spring bodies 46 should be such that when pressure is exerted onto one of the piezo-active sensor elements 36, they are bent downwards somewhat with spring bodies 46 serving as supports. This means that they should be elastic in some way, but not too soft or too elastic.

At the short ends of back support 40, hook-like cable holders 47 are provided. They serve for receiving electric connecting cables of the printed circuit board 35 not shown here and leading them in a defined way. Furthermore, pre-mount counter-hooks 49 are provided in a recess underneath cable holders 47. They serve to cooperate with the pre-mount hooks 20 to hold the four parts or the operating control unit 11, respectively, in the above-described pre-mount state after having been pressed together somewhat.

Figure 3:
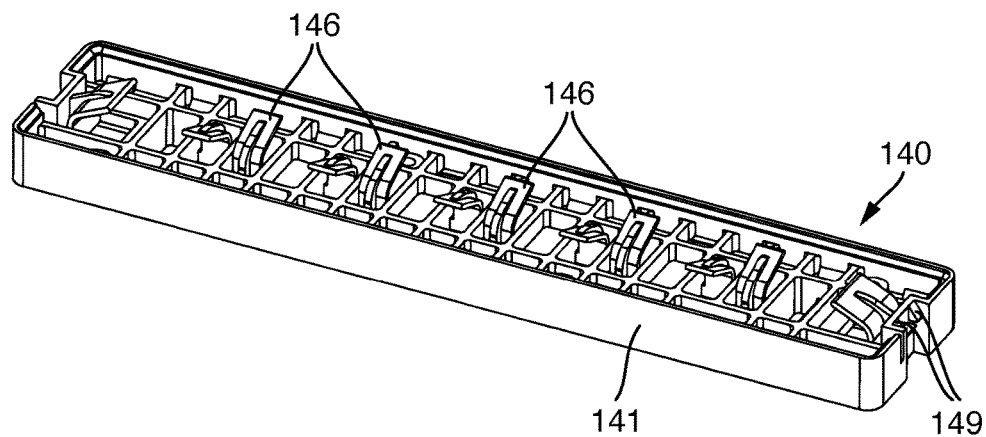
FIG. 3 is an alternative embodiment of the back support with different spring elements.

In FIG. 3, an alternative embodiment of a back support 140 is shown. In this alternative, the spring bodies of FIG. 1 are replaced by spring arms 146 formed integrally with the inner construction of back support 140 or back support casing 141, respectively. The spring arms 146 serve for the same purpose of supporting the printed circuit board on each side of the piezo-active sensor elements. Although this back support 140 is slightly more complicated in manufacture, an additional assembly step of inserting the spring bodies into the back support is obsolete. Also from this view in FIG. 3, pre-mount counter-hooks 149 can be seen more clearly.

Figure 4:
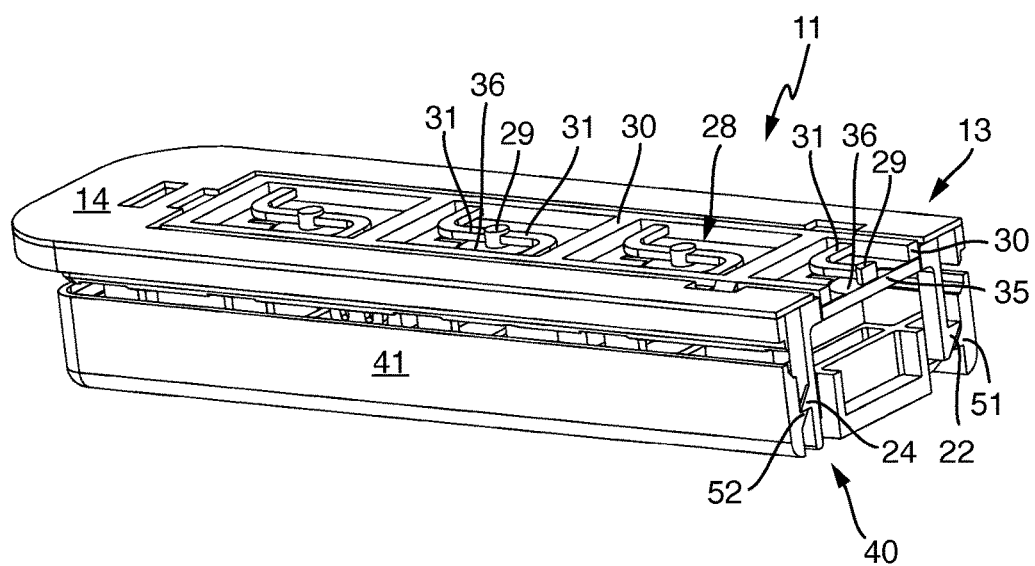
FIG. 4 is the operating control unit of FIG. 1 in the pre-mount state after pre-assembly.

In FIG. 4, the operating control unit 11 is shown in its above-described pre-mount state. This means that the force transmission holder 28 and the printed circuit board 35 are inserted into the frame opening 17. Then the back support 40 is pressed against frame backside 15 in a way that the pre-mount hooks 20 engage over the pre-mount counter-hooks 49. In this state, the spring bodies 46 already are slightly pressed against the backside of the printed circuit board 35, which means that this and also the force transmission holder 28 are held in the frame opening 17 in place and cannot be lost or displaced again. As can be seen from the sectional view at the section, a distance element 24 rests against a distance counter-hook 52 provided on the inner side of the back support casing 41. As several such distance elements 24 are provided on the frame body 13, as can be taken from FIG. 1, the parts are held together firmly in this pre-mount state.

It can also be seen that the final-assembly hooks 22 have not yet hooked behind final-assembly counter-hooks 51, which are also provided on the inside of the back support casing 41. If the back support 40 would be pressed somewhat more against frame body 13, for example 1 mm to 3 mm or even 5 mm, they act together and hold the back support 40 in a tight position against the frame backside 15. Then the circumferential gap between the two parts would also vanish and the printed circuit board 35 is enclosed. However, for pressing back support 40 somewhat more against frame backside 15, the distance elements 24 need obviously be pushed away from the distance counter-hooks 52. This can be done manually or with special tools.

Figure 5:
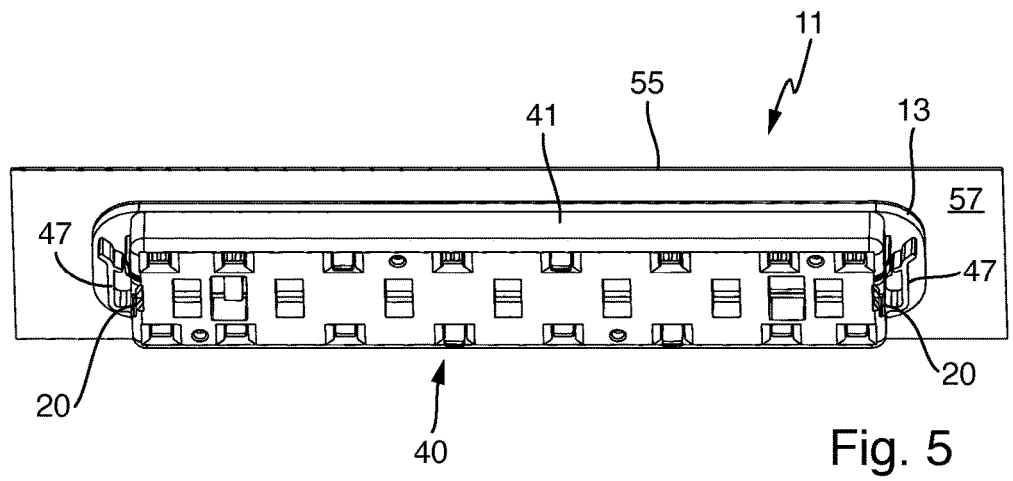
FIG. 5 is the operating control unit affixed to the underside of an operating field in its final-assembly state.

In the view of FIG. 5, the operating control unit 11 is affixed to an operating field 55 or its underside, 57, respectively. This operating field 55 can be a rather thin metal sheet or the like, preferably from stainless steel or aluminum, which may for example be a frame or rim part of a cooking field or a baking oven as well as a casing or a cover of a kitchen hood. To fix the frame topside 14 to the underside 57, several options such as a special glue or also an adhesive tape may be provided, as is known in the art. An adhesive tape with a removable protective cover film is preferred, because it can be affixed to the frame topside 14 before any of the other parts of the operating control unit 11 are provided on the frame body 13. Furthermore, there is no risk of overdosing a glue such that it may get into frame opening 17 and impair the functionality of the operating control unit.

In this position, the pre-mount hooks 20 have moved away again from the pre-mount counter-hooks, which is, however, no problem. To replace their function, final-assembly hooks 22 are now reaching behind final-assembly counter-hooks 51, of which each a plurality is provided along frame body 13 and back support 40, such that the two parts are affixed solidly and tightly to each other. Furthermore, as has been described before, in this final-assembly state the spring bodies 46 are pressed with some force against the backside of the printed circuit board 35, which in turn is pressing the piezo-active sensor elements 36 against the pressure elements 29. The pressure elements 29 in this state are applied against the underside 57 of the operating field 55, such that any pressure exerted onto the topside 56 of the operating field 55 above one of the piezo-active sensor elements 36 is transmitted via the pressure elements onto the sensor elements. This will generate an electric signal that can be evaluated accordingly, which is known in the art.

Figure 6:
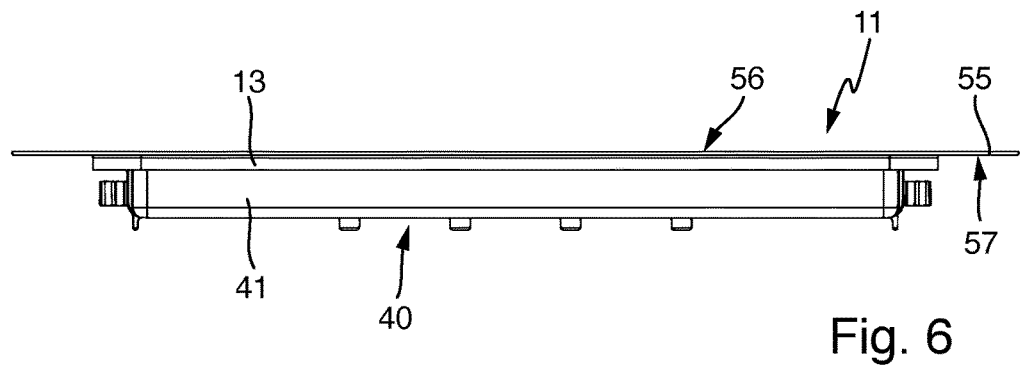
FIG. 6 is the configuration of FIG. 5 in the side view.

In the side view of FIG. 6, it can easily be seen that the operating control unit 11 in its final-assembly state has the back support 40 pressed tightly against frame body 13, which again is affixed to the underside 57 of the operating field 55.

That which is claimed:

1. An operating control unit for an electrical appliance with an operating field, wherein said
    operating control unit is formed to be mounted on an underside of said operating field, wherein said operating control unit comprises:
    a frame body with a frame topside to be mounted to said underside of said operating field, wherein said frame body comprises locking means protruding from said frame body, and wherein said frame body comprises a frame opening;
    a flat component carrier mounted to said frame body from behind, wherein said component carrier comprises piezo-active sensor elements provided on a topside of said component carrier facing said frame body and said underside of said operating field; and a back support mounted to a back side of said frame body and enclosing said component carrier, wherein said back support is fixed to said frame body via locking means of said frame body interlocking with counter locking means on said back support, wherein said operating control unit comprises after pre-assembly two different assembly states, wherein a first state is a pre-mount state and a second state is a final-assembly state, wherein in said pre-mount state said back support is fixed to said frame body enclosing said component support, and some of said locking means of said frame body are formed as pre-mount locking means and are holding said back support against disassembly, wherein in said final-assembly state said back support is pressed closer to said frame body with less distance between the two than in said pre-mount state, and final-assembly locking means of said frame body are provided for holding said back support in a closer position than said pre-mount locking means, and wherein force transfer means are provided on said topside of said piezo-active sensor elements, said force transfer means being provided with pressure elements with a cross-section significantly smaller than a size of one said piezo-active sensor element, wherein said pressure elements are elastically arranged on a force transmission holder.

2. The operating control unit according to claim 1, wherein said pre-mount locking means are provided for holding said frame body, said component carrier and said back support in said pre-mount state.

3. The operating control unit according to claim 1, wherein in said final-assembly state said back support is between 1 millimeter (mm) and 5 mm to 10 mm closer to said frame body than in said pre-mount state.

4. The operating control unit according to claim 1, wherein spring elements are provided between said component carrier and said back support for pressing said component carrier elastically in a direction towards said frame body.

5. The operating control unit according to claim 4, wherein said spring elements are arranged on said back support, and wherein said arrangement of said spring elements is such that each said piezo-active sensor element has two neighboring said spring elements such that each said piezo-active sensor element is placed between said two neighboring spring elements.

6. The operating control unit according to claim 5, wherein said spring elements are elastically deformable bodies made from elastic material, wherein said deformable bodies are arranged in receiving openings of said back support being provided with hook means on an inner side of said receiving openings for fixing said deformable bodies after insertion.

7. The operating control unit according to claim 1, wherein said component carrier is arranged inside said frame opening and is secured by holding means on its upper side against movement in a direction to said operating field over said topside of said frame body.

8. The operating control unit according to claim 7, wherein said holding means are also inserted into said frame opening.

9. The operating control unit according to claim 1, wherein said force transmission holder is arranged on said topside of said component carrier.

10. The operating control unit according to claim 9, wherein for each of said piezo-active sensor elements one said pressure element is provided, wherein all said pressure elements are connected in one piece to said force transmission holder.

11. The operating control unit according to claim 10, wherein said force transmission holder is arranged in said frame opening.

12. The operating control unit according to claim 1, wherein in said pre-mount state said piezo-active sensor elements are pressed against said pressure elements of said force transfer means, wherein said pressure elements do not project over a plane of said frame opening or said topside of said frame body, wherein said spring elements of said back support are in contact with said underside of said component carrier.

13. The operating control unit according to claim 1, wherein distance elements are provided between said frame body and said back support, wherein said distance elements are provided either on said frame body or on said back support and in said pre-mount state are in contact with said other part in a pre-mount position, respectively, and keep said two parts from moving closer to each other than said pre-mount state, wherein said distance elements are arranged and formed such that they are movable out of said pre-mount position into a final-assembly position such that said back support can be pressed closer to said frame body into said final-assembly state.

14. The operating control unit according to claim 1, wherein said distance elements are elastic and are bendable or movable to a side.

15. An electrical appliance with an operating field and an operating control unit provided on said underside of said operating field, wherein said operating control unit is formed according to claim 1.

* * * * *